United States Patent [19]

DeSantis et al.

[11] 4,181,385

[45] Jan. 1, 1980

[54] LOW PROFILE SOCKET FOR CIRCUIT BOARD WITH GAS VENTS FOR FIXED POSITION SOLDERING

[75] Inventors: John A. DeSantis, North Lauderdale; Ellis J. Gottlieb, Ft. Lauderdale, both of Fla.

[73] Assignee: Motorola, Inc., Schaumburg, Ill.

[21] Appl. No.: 891,970

[22] Filed: Mar. 30, 1978

[51] Int. Cl.² ............................................. H05K 1/12
[52] U.S. Cl. .............................. 339/17 C; 339/275 B
[58] Field of Search ............... 339/17 R, 17 C, 220 R, 339/220 T, 275 R, 275 B; 361/400, 401

[56] References Cited

U.S. PATENT DOCUMENTS

| | | | |
|---|---|---|---|
| 3,368,188 | 2/1968 | Olsson | 339/275 R |
| 3,777,303 | 12/1973 | McDonough | 339/17 C |
| 3,980,367 | 9/1976 | Laserson et al. | 339/275 B |
| 4,070,077 | 1/1978 | Clark | 339/17 C |

*Primary Examiner*—Neil Abrams
*Attorney, Agent, or Firm*—Donald B. Southard; James W. Gillman

[57] ABSTRACT

Socket for use on a circuit board which can be eyeletted to secure the socket in fixed position on the board with the head of the socket engaging the board. The head is shaped, as with flat sides, so that a vent passage extends from the space for solder between the socket and the opening in the circuit board. The head has a top surface at a fixed height above the board, and has a tapered opening to receive a plug-in connector pin. The circuit board structure, with the socket soldered to the conductor on the inside surface of the opening in the circuit board, provides a good electrical connection to the socket.

10 Claims, 4 Drawing Figures

LOW PROFILE SOCKET FOR CIRCUIT BOARD WITH GAS VENTS FOR FIXED POSITION SOLDERING

BACKGROUND OF THE INVENTION

It is common practice to provide sockets for plug-in components on circuit boards, for low cost chassis construction. It is desired to make solder connections to the sockets at the same time other connections are made, as by a wave soldering process. It has been proposed to use eyelet type sockets which are attached to the board before the soldering process. However, such sockets must be loose so that solder can enter from the bottom to fill the space between the socket and a conductive layer on the opening of the board. Also, the socket cannot have a head which engages the top of the circuit board and closes the space for solder, as the gas produced during soldering will form in pockets and prevent good solder connections. This may result in entrapment of contaminants within the solder which can cause long term reliability problems. For the above reasons, eyelet type sockets have had to float in the openings in the circuit board during soldering, and will not be held in predetermined positions when the soldering is completed and the sockets are held in fixed positions. This presents a problem, in particular, when a plurality of sockets are used to receive the connector pins of a single circuit component, as the sockets may not be properly positioned to receive the connector pins, and the heads of all the sockets may not be at the same height above the circuit board. It may be difficult, or impossible to plug in the component, and the component will not rest securely if all the sockets are not at the same height.

SUMMARY OF THE INVENTION

It is an object of this invention to provide an improved eyelet type socket for use on a printed circuit board.

A further object of the invention is to provide a socket which can be eyeletted on a circuit board to hold the same in fixed position during soldering, and which vents the gas produced.

A still further object of the invention is to provide a socket having a head which can be held in fixed position on a circuit board during soldering so that the top of the head is at a fixed height above the board after it is soldered to the board.

Still another object is to provide a circuit board structure including a conductive socket extending through an opening in the board which has a conductive surface, with the socket having an annular head with flat sides held against one side of the board, and slots in the end of the socket opposite the head forming extending portions which are eyeletted to hold the socket in place, with solder being applied through the slots into the space between the socket and the conductive surface, and the flat sides of the head providing gas vents for such space.

In accordance with the invention, a socket for a circuit board is provided which can be eyeletted in fixed position on the board before soldering, so that the socket remains in the desired position during the soldering. The socket has a tubular body with a head at one end adapted to rest against the top side of the circuit board when the socket is placed in an opening therein. The head has a generally annular shape, with flat surfaces on opposite sides which are substantially tangent to the outside surface of the body. The head forms a rim which has a flat top surface at a fixed height above the circuit board. The end of the tubular body opposite to the head has reduced thickness and slots therein, forming a plurality of extending ports which can be formed over or eyeletted against the bottom side of the circuit board. The socket can be soldered to the conductive surface on the opening in the circuit board by wave soldering, or other known processes, with solder flowing between the slots or spaces between the extending ports and into the space about the conducting socket within the opening in the circuit board. The solder will rise within this space and the gas produced can escape through the vents provided by the flat sides of the head, so that the solder will completely engage the socket and the conductive surface, and can extend above the top surface of the circuit board.

DETAILED DESCRIPTION OF THE DRAWINGS

Figure 1:
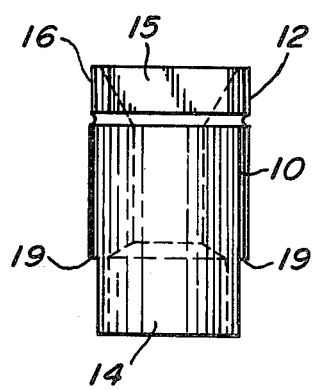
FIG. 1 shows the eyelet type socket of the invention.
Figure 2:
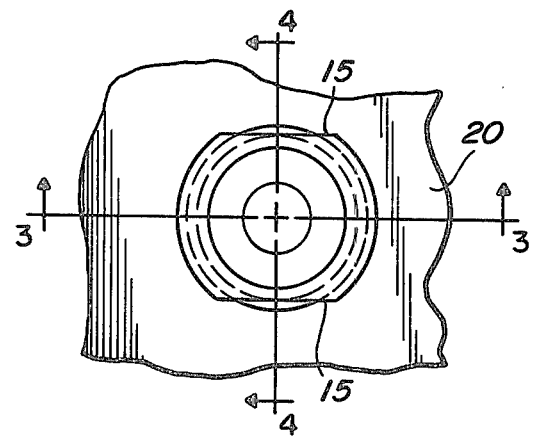
FIG. 2 is a top view of the socket on a circuit board.
Figure 3:
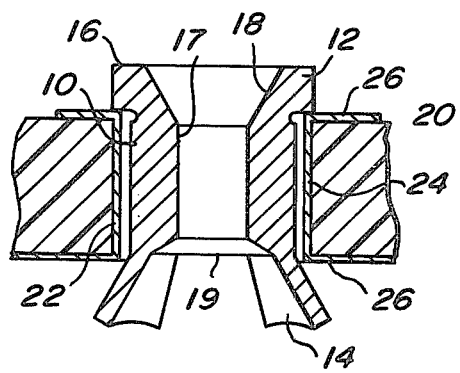
FIG. 3 is a cross-sectional view of the socket and circuit board of FIG. 2, along the lines 3—3 thereon.
Figure 4:
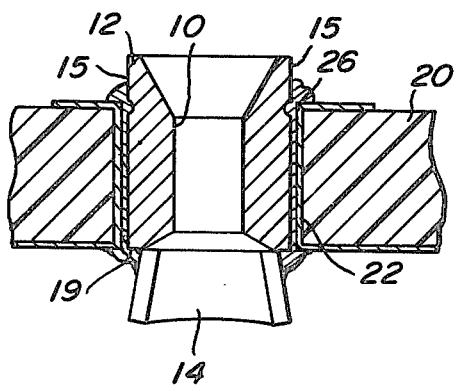
FIG. 4 is a cross-sectional view along the lines 4—4 of FIG. 2.

FIG. 1 shows the socket for use on a circuit board of the invention, and FIGS. 2, 3 and 4 show the socket in position on a circuit board. The socket includes an elongated tubular body portion 10 with a head 12 at one end, and extending portions 14 at the opposite end for eyeletting the socket to the board. The head 12 is a generally annular rim with opposite flat sides 15 and a flat top surface 16. The flat sides 15 are substantially tangent to the outside surface of the tubular portion 10, forming parts which do not project beyond this outside surface or diameter. The head 12 has a uniform thickness so that its flat top surface 16 is at a fixed height above the board, when the socket is secured to the board 20.

The socket has an opening 17 in the tubular body portion 10 thereof which is flared or tapered outwardly at the top, as shown at 18 in FIG. 3. This facilitates the insertion of a connector pin conductor into the socket. A slot 19 is provided at the bottom of the socket so that the extending portions 14 are spaced apart. The portions 14 are thinner than the body 10 of the socket to facilitate the forming over or eyeletting operation.

FIGS. 2, 3 and 4 show the socket in position on the circuit board 20, with the body portion 10 thereof extending through the opening 22 therein. As shown in FIG. 3, the head 12 of the socket rests directly on the top surface of the board 20. The body portion 10 has a length substantially the same as, or slightly less than, the thickness of the circuit board 20. For example, the thickness of the board may be 0.062 inch and the length of the tubular portion may be 0.057 inch. The extending portions 14 are formed over against the bottom of the board 20 to hold the socket in fixed position on the board. The circuit board 20 is of a known type having conductive material 24 on the inside surface of the opening 22, which is connected to a conductive layer 26 on the top and/or the bottom surface of the board 20.

The socket is of conductive material, and is soldered to the conductive layer 24 on the board 20 by applying solder between the outside surface of the tubular portion 10 of the socket and the layer 24 on the inside surfce of the opening 22 in the board. The inside of the tubular portion 10 is filled with a material such as latex to prevent solder from flowing into this space. The outside diameter of tubular portion 10 is smaller than the diameter of opening 22 so that there is a space therebetween which may be of the order of three mills. The socket and other components may be soldered to the circuit board by reflow soldering, such as a wave soldering process, whereby solder enters through the openings or slots 19 between the extending portions 14 and wicks up between the outside of the socket within the opening 22. As the flat portions 15 of the head 12 do not extend beyond the outside surface of the body portion 10 of the socket, openings or vents are provided at the top surface of the circuit board 20, and the solder can rise all the way to the top with a meniscus 26 above the top surface of the circuit board 20. The flat portions 15 of the head, in effect, provide vents for escape of gas produced during the soldering, so that such gas is not captured in pockets in the solder, to reduce the contact area between the solder and the socket and the conductive layer 22. This results in a high reliable solder connection between the socket and the conductive layer on the circuit board 20.

The socket is firmly constrained in a direction perpendicular to the board by the eyeletting operation, so that the head 12 thereof is held against the top surface of the circuit board 20, with its top surface 16 at a fixed height above the circuit board. The socket can move a limited amount in the plane of the board, and the pressure of the solder rising about the socket may tend to center the body portion 10 within the opening 22, which is desirable as it accurately positions the socket on the circuit board. However, the formed over extensions 14 hold the head 12 against the top surface of the board and the top surface 16 thereof will be held at the fixed height. This is particularly important in applications where a plurality of individual sockets, such as described, are used for connecting a plug-in component which has a plurality of connector pins, as the sockets will be accurately positioned and have top surfaces of a given height to properly receive the pins. The sockets can be used with twist pins, or connector pins of other known configurations.

The socket and combination thereof with a circuit board has been found to be highly satisfactory in small electronic devices as the socket can be secured to the circuit board, and soldered thereto with other components. The socket will be accurately positioned on the board, and the head thereof will be at a fixed height above the board. The configuration of the head of the socket forms vents for escape of gas during the soldering, and the configuration of the extensions for eyeletting allow the entry of solder so that an extremely good solder connection to the socket is provided.

We claim:

1. A socket for use on a circuit board for releasably receiving a component lead, which socket has an opening of a predetermined diameter and wherein conductive material is included on the inside surface of the opening, such socket including an elongated conductive tubular body portion having an outside diameter smaller than the predetermined diameter of the opening, an integral head on one end of said tubular body portion having a first part extending outward beyond said outside diameter to an extent greater than the difference between said outside diameter and the predetermined diameter, said head having a second part which is within the limit of said outside diameter of said tubular body portion, said tubular portion having slots therein at the end thereof opposite to said head forming extending portions with open spaces therebetween, said socket being adapted to be inserted in the opening in the circuit board with said head engaging one side of the board and said extending portions formed over against the opposite side of the board to extend outwardly and hold the socket in substantially fixed position, said open spaces of said slotted end forming passages for solder to flow into the space between said tubular body portion and the conductive material on the inside surface of the current board opening, and said second part of said head allowing gas to escape from such space.

2. A socket in accordance with claim 1 wherein said head has a top surface which is located at a fixed height above the circuit board as said socket is held in position on the circuit board.

3. A socket in accordance with claim 2 wherein said head is a rim extending outwardly from said tubular body portion in a generally annular shape with said second part thereof being a substantially flat side which is tangent to the outside surface of said tubular body portion.

4. A socket in accordance with claim 3 wherein the opening in said tubular portion has a greater inside diameter at said head to facilitate entry of a connector pin into the socket.

5. A socket in accordance with claim 1 wherein said extending portions of said tubular member have reduced thickness to facilitate forming the same.

6. A circuit structure including in combination:

a flat insulating board having an opening of a predetermined diameter therein, a conductive layer on said board which extends onto the inside surface of said opening, a socket having a conductive tubular portion with an outside diameter less than said predetermined diameter extending through said opening, said socket having a head at one end of said tubular portion engaging said insulating board on one side thereof, said head having a portion which is within the limit of said outside diameter, said tubular portion having slots in the end thereof opposite to said head forming extending portions with open spaces therebetween, said extending portions being formed against the side of said insulating board opposite to said one side thereof to hold said socket in position on said board, and solder about said tubular portion within said conductive layer on said opening forming an electrical connection between said socket and said conductive layer, said open spaces in said tubular portion forming passages for solder to enter the space about said socket within said conductive layer and said portion of said head allowing gas from said solder to escape.

7. A structure in accordance with claim 6 wherein said extending portions hold said socket against movement in the direction perpendicular to the plane of said board.

8. A structure in accordance with claim 6 wherein said head has a top flat surface which is located at a fixed height above said board.

9. A structure in accordance with claim 8 wherein said head is a generally annular rim extending outwardly from said tubular portion with substantially flat opposite sides which are generally tangent to the outside surface of said tubular portion.

10. A structure in accordance with claim 6 wherein the opening in said tubular portion tapers outwardly to a maximum diameter at the top of said head of said socket to facilitate entry of a connector pin therein.

* * * * *